United States Patent [19]

Watanabe et al.

[11] Patent Number: 4,922,458
[45] Date of Patent: May 1, 1990

[54] OUTPUT BUFFER CIRCUIT

[75] Inventors: Kazuo Watanabe; Yoshinori Sato, both of Kanagawa, Japan

[73] Assignee: Sony Corporation, Tokyo, Japan

[21] Appl. No.: 249,302

[22] Filed: Sep. 26, 1988

Related U.S. Application Data

[63] Continuation of Ser. No. 883,119, Jul. 8, 1986.

[30] Foreign Application Priority Data

Jul. 12, 1985 [JP] Japan .................................. 60-153686

[51] Int. Cl.⁵ .............................................. G11C 11/40
[52] U.S. Cl. ................................ 365/189.05; 365/181; 365/194; 365/210; 365/230.06
[58] Field of Search ............... 365/149, 210, 202, 181, 365/189, 194, 230, 156, 189.01, 189.05, 230.06, 230.08

[56] References Cited

U.S. PATENT DOCUMENTS 4,774,690 9/1988 Watanabe et al. .................. 365/189

Primary Examiner—Terrell W. Fears
Attorney, Agent, or Firm—Ronald P. Kananen

[57] ABSTRACT

In an output buffer circuit for a memory including complementarily-connected P-channel and N-channel MOS transistors, a voltage is induced across the lead inductance whenever the load capacitance is charged or discharged through the lead inductance during the switching operation of the buffer circuit. This induced voltage changes the ground level or the supply voltage level, and results in a problem such that data signals read from the memory are distorted. To overcome this problem, one of the two MOS transistors through which an electric charge is charged or discharged is divided into two MOS transistors of a small size, and the data signal is applied to one of the divided MOS transistors directly and to the other thereof through a delay element so that the peak of the induced voltage is lowered without increasing the access time of the memory.

19 Claims, 6 Drawing Sheets

FIG. 3A
FIG. 3B
FIG. 3C
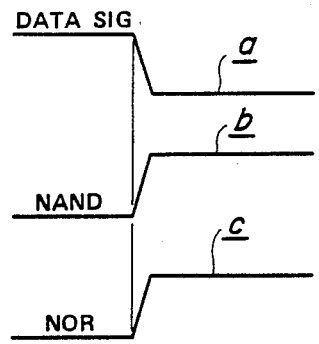
FIG. 3D
FIG. 3E
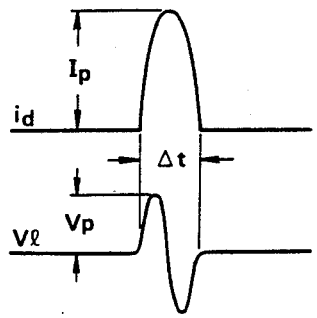
(Prior Art)
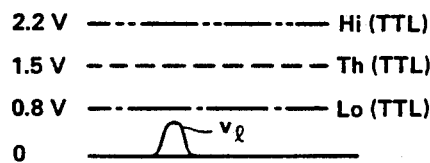
FIG. 4
(Prior Art)

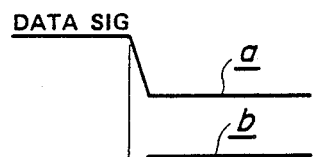
FIG.6A DATA SIG
FIG.6B NAND
FIG.6C 1ST NOR
FIG.6D 2ND NOR
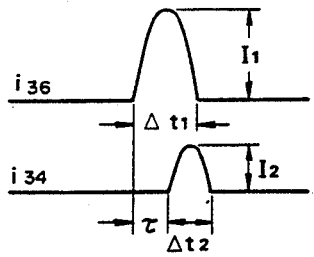
FIG.6E $i_{36}$
FIG.6F $i_{34}$
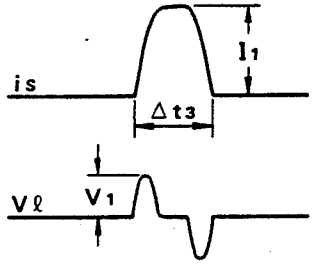
FIG.6G $i_s$
FIG.6H $V_\ell$

OUTPUT BUFFER CIRCUIT

This is a continuation of co-pending application Ser. No. 883,119, filed on July 8, 1986.

BACKGROUND OF THE INVENTION

1. Field of the Invention

The present invention relates to an output buffer circuit and more specifically to an output buffer circuit for a memory. More specifically, this invention relates to an output buffer circuit for a memory wherein one of a pair of complementarily-connected MOS transistors is divided into two smaller-sized MOS transistors so that the load capacitance is discharged during switching through two paths through the divided MOS transistors, one of which is delayed relative to the other.

2. Description of the Prior Art

Conventionally, an MOS memory is widely used as a storage device of an electronic computer. An MOS memory has a great number of memory cells made up of MOS transistors which are arranged to form a memory matrix. Information is written into or read from the memory matrix in accordance with any selected addresses. To read any given information from the above-mentioned memory cells, predetermined addresses are selected by a selector and the data are read through an output buffer circuit under control of a read/write control circuit. The output buffer circuit outputs data signals in accordance with a control signal such as an output disable signal applied to the output buffer circuit through a logic circuit.

In the above-mentioned output buffer circuit, the data signal and the output disable signal are applied to each of the gates of a pair of complementarily-connected P-channel and N-channel MOS transistors through the logic circuit and the data signal is outputted from an intermediate junction point between the two drains of the MOS transistors. The source of one of the two MOS transistors is connected to a power supply and the source of the other of the two MOS transistors is connected to ground through a lead inductance caused by the aluminum wires and/or the bonding wires within a semiconductor chip and/or the lead wires of a lead frame. A load capacitance having a capacity determined in accordance with the MOS memory standard is connected to the output terminal thereof. When the load capacitance is charged or discharged through the lead inductance during the switching operaton of the buffer circuit, an induced voltage is inevitably generated across the lead inductance. This induced voltage changes the potential of the reference voltage of the other circuits connected to the memory matrix. In particular, when several output buffer circuits are incorporated within the memory unit, plural induced voltages are generated simultaneously to a high voltage such as several hundreds millivolts or more.

On the other hand, since the input levels of the control signals supplied to the other circuits are determined by the TTL level, the control signals are distorted or disturbed by the induced voltage. In this connection, it is possible to reduce the induced voltage by decreasing the size of the MOS transistor. However, this results in a serious problem such that the access time to the memory is lengthened.

The circuit configuration of the prior art output buffer circuit will be described in further detail hereinafter with reference to the attached drawings in the detailed description of the preferred embodiments.

SUMMARY OF THE INVENTION

With these problems in mind, therefore it is a primary object of the present invention to provide an output buffer circuit which can reduce the induced voltage developed across the lead inductance when the load capacitance is charged or discharged during the switching operation of the buffer circuit.

To achieve the above-mentioned object, in the output buffer circuit a P-channel MOS transistor and an N-channel MOS transistor are complementarily-connected in such a way that a data signal read from the memory unit is applied in common to each of the gates of the two MOS transistors selectively in response to a combination of the data signal and an output disable siganl through plural logical elements. The data signal is outputted from an intermediate junction point between the two drains of the two MOS transistors. The present invention is characterized in that (a) either of the two P-channel and N-channel MOS transistors through which an electric charge of a load capacitance connected to the intermediate junction point is charged or discharged is divided into two first and second MOS transistors each having a small size and that (b) the data signal is selectively applied to a gate of the first divided MOS transistor directly and to a gate of the second divided MOS transistor through a delay circuit.

In the circuit configuration according to the present invention, sicne the current discharged from the load capacitance to the lead inductance or charged vice versa is divided into two routes in a time-delayed relationship between the two, it is possible to reduce the peak value and the rising slope of the induced voltage without increasing the access time in the memory unit. Therefore, it is possible to effectively solve the problem such that the reference potential in the memory circuit is fluctuated due to the induced voltage across the lead inductance; that is, the data signal read from the memory unit is distorted in waveform.

BRIEF DESCRIPTION OF THE DRAWINGS

The features and advantages of an output buffer circuit for a memory unit according to the present invention over the above-mentioned prior art output buffer circuit will be more clearly appreciated from the following description of the preferred embodiments of the invention taken in conjunction with the accompanying drawings, in which like reference numerals designate the same or similar elements or sections throughout the figures thereof and in which:

FIGS. 3A–3E are timing charts of various signals of the prior art buffer circuit shown in FIG. 2;

FIG. 4 is a diagram showing the level of a voltage induced across a lead inductance in comparison with a supply voltage and TTL levels;

FIGS. 6A–6H are timing charts of various signals of the output buffer circuit shown in FIG. 5;

DETAILED DESCRIPTION OF THE PREFERRED EMBODIMENTS

To facilitate an understanding of the present invention, reference will be made to a prior art memory unit 10 and a prior art output buffer circuit incorporated with the memory unit with reference to the attached drawings.

Figure 1:
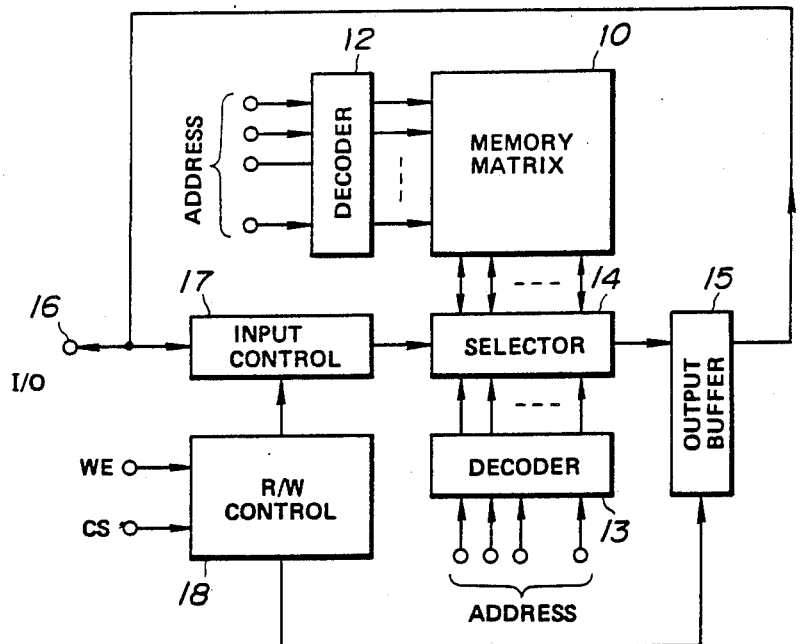
FIG. 1 is a schematic block diagram showing an example of system configurations of a MOS memory to which an output buffer circuit can be applied for assistance in explaining the present invention.

FIG. 1 shows a system configuration of a prior art memory unit. In FIG. 1, the reference number 10 denotes a memory matrix. When an address input is applied to decoders 12 and 13, a memory cell (not shown) at a predetermined address in the matrix 10 is selected by the two decoders 12 and 13 and a selector 14, and data written in the selected memory cell can be read from an input/output (1/0) terminal 16 through the selector 14 and an output buffer circuit 15. Further, an input control circuit 17 connected between the selector 14 and the input/output terminal 16 is controlled according to read/write (R/W) modes by a R/W control circuit 18 together with the output buffer circuit 15. Further, in FIG. 1, the symbol WE denotes a write enable signal, and the symbol CS denotes a chip select signal, both of which are applied to the R/W control circuit 18.

Figure 2:
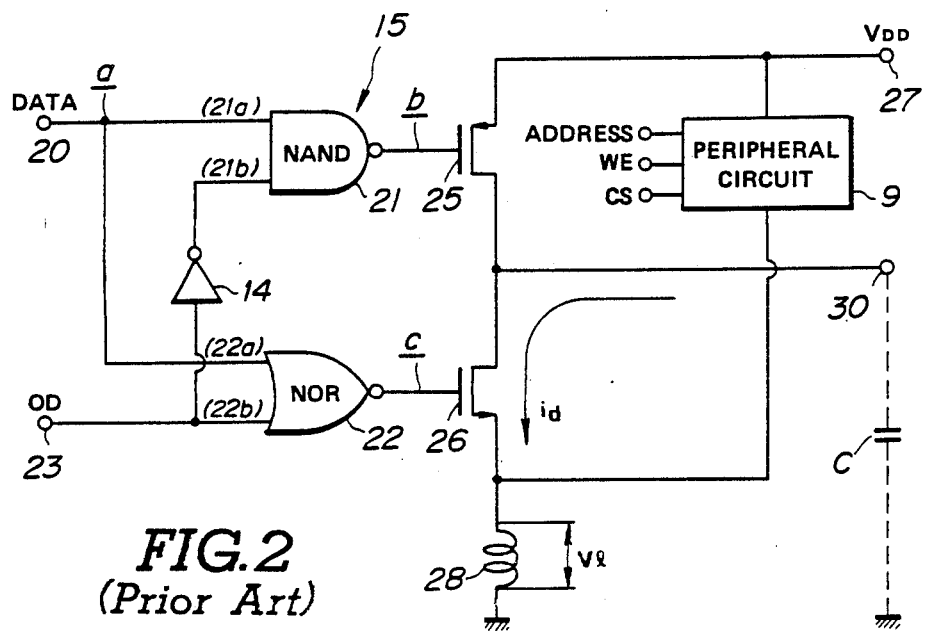
FIG. 2 is a schematic block diagram showing an example of prior art output buffer circuits.

FIG. 2 shows an example of the practical circuit configurations of the output buffer circuit 15.

As shown in FIG. 2, a data signal is supplied in common to one of the input terminals 21a of a NAND gate 21 and an input terminal 22a of a NOR gate 22 through the data input terminal 20. Further, a control signal or an output disable signal (referred to as an "OD signal" hereinater) is supplied through a control signal input terminal 23 directly to the other input terminal 22b of the NOR gate 22 and indirectly to the other input terminal 21b of the NAND gate 21 by way of an inverter 24.

The output of the NAND gate 21 and the output of the NOR gate 22 are respectively applied to the gates of a P-channel MOS transistor 25 and an N-channel MOS transistor 26 which are complementarily connected to each other by connecting their respective drains. The source of the P-channel MOS transistor 25 is connected to a power supply terminal 27 while the source of the N-channel MOS transistor 26 is grounded through a lead inductance 28. The drains of the MOS transistors 25 and 26 are directly connected to each other, and an output terminal 30 is connected to an intermediate junction point between the commonly-connected drains. A capacitor C having a capacity determined in accordance with the MOS memory standard is connected to the output terminal 30. A plurality of the output buffer circuits 15 as shown in FIG. 2 are mounted on the memory according to the number of the output ports for the memory unit.

The lead inductance 28 is caused by aluminum wires and/or bonding wires within a semiconductor chip and/or lead wires of a lead frame. Further, a peripheral circuit 19, made up of the two decoders 12 and 13, the selector 14, and the two control circuit 17 and 18 as shown in FIG. 1, is also grounded through the inductance 28.

The operation of the output buffer circuit 15 shown in FIG. 2 will be described below.

First, if the OD signal of the control signal input terminal 23 is at a logical "1" level, a logical "0" level of the output of the inverter 24 is applied to the other input 21b of the NAND gate 21, irrespective of the data signal applied to the input 21a of the NAND gate 21, the output of the NAND gate 21 is a logical "1", so that the P-channel MOS transistor 25 is turned off. At this time, since the other input 22b of the NOR gate 22 is also at a logical "1" level, irrespective of the data signal applied to the input 22a of the NOR gate 22, the output of the NOR gate 22 is at a logical "0" lvel, so that the N-channel MOS transistor 16 is also maintained in an off state. Therefore, when the OD signal is a logical "1", the output buffer circuit 15 shown in FIG. 2 will not operate.

As readily understood above, the NAND gate 21 and the NOR gate 22 are used to make the output buffer circuit 15 a tri-state device.

Next, when the OD signal at the control signal input terminal 23 is at a logical "0" level, if the data signal at the input terminal 20 changes to a logical "1" or high level, since a logical "1" level at the output of the inverter 24 is applied to the other input terminal 21b of the NAND gate 21, the output of the NAND gate 21 is at a logical "0" level to turn on the P-channel MOS transistor 25. On the other hand, the logic signal at the input terminal 22a of the NOR gate 22 changes its output to a logical "0", or low level, to turn off the N-channel MOS transistor 26. Therefore, the output terminal 30 is connected to the power supply terminal 27 through the turned-on MOS transistor 25, so that the load capacitance C is charged up by a charge current flowing through the MOS transistor 25. Therefore, the terminal voltage at the output terminal 30 becomes equal to the power supply voltage $V_{DD}$ at the terminal 27.

In this state, as shown in FIG. 3A, if the data signal a at the input terminal 20 changed from a logical "1" to a logical "0", since the input 21a of the NAND gate 21 changes to a logical "0", the output b of the NAND gate 21 becomes a logical "1", as shown in FIG. 3B. On the other hand, since both inputs 22a and 22b to the NOR gate 22 change to a logical "0", the output c of the NOR gate 22 also changes to a logical "1" as shown in FIG. 3C. Therefore, the P-channel MOS transistor 25 is turned off and the N-channel MOS transistor 26 is turned on so that the electric charge of the load capacitance C is discharged through the N-channel MOS transistor 26 and the lead inductance 28.

Therefore, a voltage $V_l$ is induced across the lead inductance 28 having a magnitude L by the current $i_d$, as expressed by the following formula (1):

$$V_l = L \frac{d}{dt}(i_d) \quad (1)$$

As depicted in FIG. 3E, this induced voltage $V_l$ is positive on the leading edge side of the current $i_d$ shown in FIG. 3D to change the potential of the reference point or grounded line in the periphery circuit 19.

In a high speed memory, the on-time $\Delta t$ of the current $i_d$ should be reduced to as short a time as possible to an extent of several nonoseconds, for instance, in order to reduce the access time to as short a time as possible. Furthermore, where several output buffer circuits as shown in FIG. 2 are mounted on the memory, there exists a chance that all of the buffer circuits are simultaneously in the above-mentioned discharge state. Thus, the positive peak value $V_p$ of the induced voltage $V_l$ is unexpectedly high, for instance, to several hundreds of millivolts or more, for example.

On the other hand, since the input levels of the control signals supplied to the periphery circuit 19 such as an address input, write enable We, chip select CS, and so forth, are determined by the TTL (Transistor Transistor Logic) level as shown in FIG. 4, if a high induced voltage $V_p$ as described above changes the ground potential of the periphery circuit 19, the input voltage becomes apparently low on the Hi side of the TTL level, thus resulting in a problem in that the input voltage changes as if the address input changes. Then, an address transistion detector (not shown) begins to operate to short or equalize the differential input terminals of a sense amplifier (not shown). Therefore, there exists a problem in that the waveform of a read data signal is distorted.

Since the on time $\Delta t$ of the current $i_d$ is determined by the load capacitance C and the driving capacity of the N-channel MOS transistor 26, it is possible to reduce the induced voltage $V_l$ when the current driving capacity can be reduced by decreasing the size of the MOS transistor 16, because the on time $\Delta t$ of the current $i_d$ is lengthened or increased. In this case, however, a serious problem will arise with a high-speed memory in that the access time to the memory is lengthened.

The influence of the ground side lead inductance at the time when the load capacitance C is discharged has been explained hereinabove. However, even when the load capacitance C is charged, the phenomenon described above will be produced by the lead inductance arranged on the power supply side, thus resulting in a problem that the induced voltage on the power supply line exerts a harmful influence upon the memory as noise.

In view of the above description, reference will now be made to a first embodiment of the output buffer circuit for a memoy unit according to the present invention.

Figure 5:
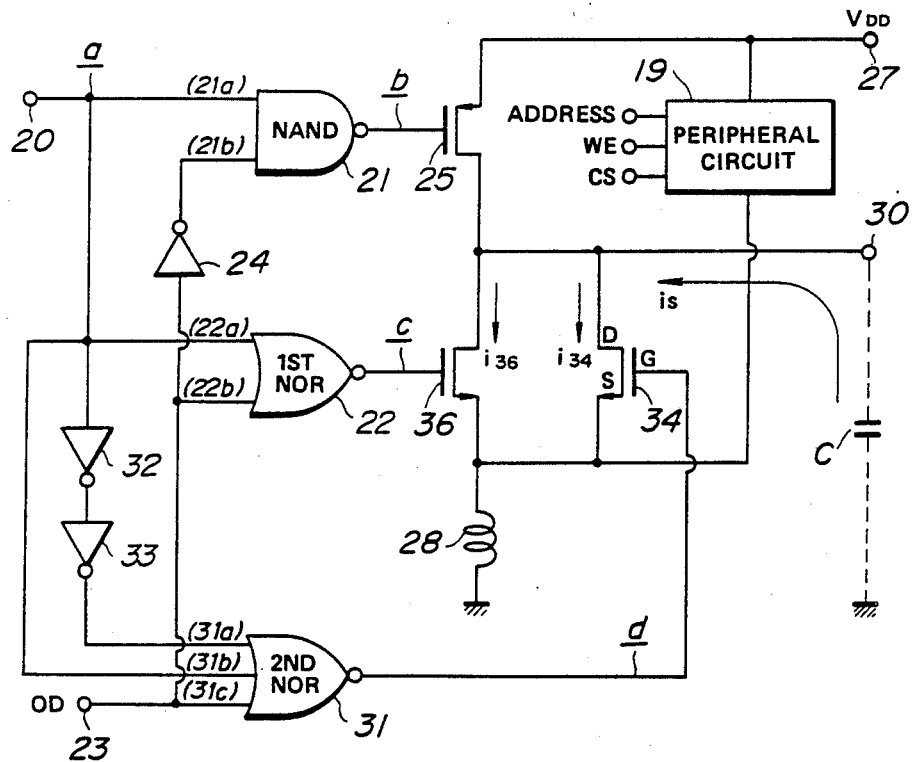
FIG. 5 is a schematic block diagram showing a first embodiment of the output buffer circuit according to the present invention.

FIG. 5 shows the circuit configuration of the first embodiment of the present invention. In FIG. 5, the same reference numerals have been retained for similar parts which have the same functions as described in connection with FIG. 2 so that a detailed description thereof is believed to be unnecessary.

In FIG. 5, a data signal from a data input terminal 20 is supplied to a first input terminal 31a of a second NOR gate 31 through two series-connected delay inverters 32 and 33 and directly to a second input terminal 31b of the second NOR gate 31. A third input terminal 31c of the second NOR gate 31 is connected to the control signal input terminal 23. An output of the second NOR gate 31 is supplied to a gate of an N-channel MOS transistor 34. A drain and a source of the N-channel MOS transistor 34 are respectively connected to a drain and a source of an N-channel MOS transistor 36 which is connected in the same way as the N-channel MOS transistor 26 shown in FIG. 2. The relative sizes of the MOS transistors 34 and 36 are determined to be about 40% and 60% of the size of the MOS transistor 26 shown in FIG. 2. Thus, the N-type MOS transistor 26 of FIG. 2 is, in effect, replaced by the MOS transistors 36 and 34 of FIG. 5 to provide two discharge paths for the capacitor C, as will be explained in detail. The remaining parts other than those described above are the same as shown in the circuit shown in FIG. 2.

The embodiment of FIG. 5 operates as follows. First, when the OD signal of the control signal input terminal 23 is a logical "138 , since the third input 31c of the second NOR gate 31 is a logical "1", the output of the second NOR gate 31 is a logical "0" irrespective of the logical state at the first and second inputs 31a and 31b, so that the N-channel MOS transistor 34 is turned off. At this time, since the MOS transistors 25 and 26 are off as previously described, this embodiment will not operate and its output is effectively disabled.

Next, when the OD signal of the control signal input terminal is a logical "0", if a data signal at the input terminal 20 changes to a logical "1", the second input 31b of the second NOR gate 31 changes to a logical "1" and therefore the output thereof is at a logical "0" state, so that the N-channel MOS transistor 34 is off. Therefore, the output terminal 30 is connected to the power supply terminal 27 through the turned-on MOS transistor 25, as described for these input conditions in FIG. 2, to charge the load capacitance C, so that the terminal voltage at the terminal 30 becomes equal to the power supply voltage $V_{DD}$ at the terminal 27.

In this state, as shown in FIG. 6A, when a data signal a at the input terminal 20 changes from a logical "1" to a logical "0", the output b of the NAND gate 21 changes to a logical "1" as shown in FIG. 6B and the output c of the first NOR gate 22 also changes to a logical "1" as shown in FIG. 6C. Since the first input 31a of the second NOR gate 21 is inverted from a logical "1" to a logical "0" delayed by a predetermined delay time from the second input, that is, the data signal a shown in FIG. 6A by passing through the delay inverters 32 and 33, the output d of the second NOR gate 21 is inverted from a logical "0" to a logical "1" and is delayed by a time $\tau$ from the output c of the first NOR gate 12 (shown in FIG. 6C), as shown in FIG 6D. In response to the inversion of the data signal a, the P-channel MOS transistor 25 is turned off and N-channel MOS transistor 36 is turned on. Further, the N-channel MOS transistor 34 is turned after being delayed by the time $\tau$.

Therefore, the electric charge of the load capacitance C is passed first through the N-channel MOS transistor 36 of a 60% size, rising more gently than in the conventional circuit, as shown in FIG. 6E, and then discharged on the basis of a current $i_{36}$ having roughly the same on-time $\Delta t_1$ and a lower peak value $I_1$ (FIG. 6E).

In response to the progress of the discharge started being delayed by a time $\tau$ from when the MOS transistor 36 starts to discharge, when the terminal voltage of the load capacitance C drops to some extent from that of the power supply voltage $V_{DD}$, a discharge begins on the basis of the current $i_{34}$ passing through the N-channel MOS transistor 34 of a 40% size, as shown in FIG. 6F. The current $i_{34}$ has a lower peak value $I_2$ and a shorter on-time $\Delta t_2$, as shown in FIG. 6F, compared to the current $i_{36}$ shown in FIG. 6E.

In this embodiment, since the total current $i_s$ flowing through the lead inductance 28 is the sum of the currents $i_{34}$ and $i_{36}$ flowing through both the MOS transistors 34 and 36, the total current $i_s$ has the same leading edge and the same peak value $I_1$ as those of the current $i_{36}$ of the 60% sized MOS transistor 36, as shown in FIG. 6G. Further, the magnitudes and the timings of the currents $i_{34}$ and $i_{36}$ are so determined that the current $i_s$ has an on-time $\Delta t_3$ which is a little longer than the on-time $\Delta t$ of the current $i_d$ in the conventional circuit. Furthermore, the integral of the currents $i_{34}$ and $i_{35}$ is equal to that of the current $i_d$ in the conventional circuit. In other words, the sizes of both the N-channel MOS transistors 34 and 36 are determined as described above and further the delay time of the inverters 32 and 33 is determined to be 2 nanoseconds for instance.

In the present invention, as described above, since the sizes of the MOS transistors 36 and 34 for passing the discharge current from the load capacitance C are divided into two paths and further either one of them is turned on after being delayed relative to the other by an appropriate time, it is possible to reduce the peak value $V_1$ of the induced voltage $V_l$ of the lead inductance 28 caused by the discharge current down to 75% of th conventional circuit while only lengthening its on-time a little. Thus, a harmful influence upon the access time is scarcely exerted.

Furthermore, in this first embodiment, since the integral of the discharge current $i_s$ is equal to that in the conventional circuit, it is possible to maintain the magnitude of the direct current component of the absorbing current at the same magnitude of the conventional circuit when the output signal is "Lo", thus preventing the operation stability from being deteriorated.

Figure 7:
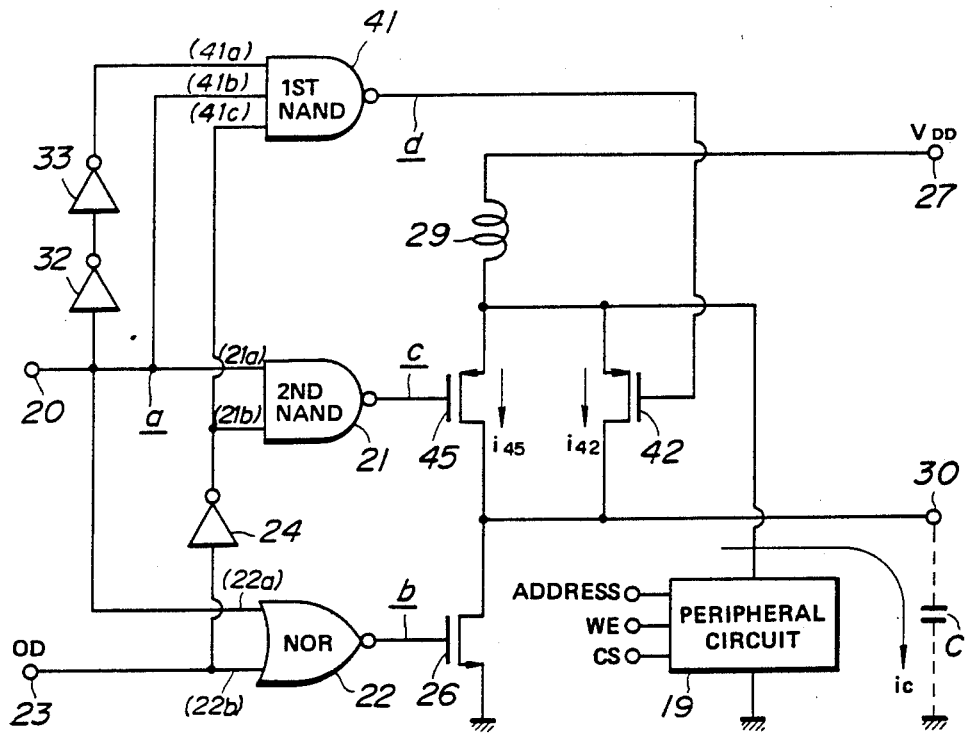
FIG. 7 is a schematic block diagram showing a second embodiment of the output buffer circuit according to the present invention.

With reference to FIGS. 7 and 8, another embodiment of the output buffer circuit for a memory according to the present invention will be described hereinbelow.

FIG. 7 shows the circuit configuration of the second embodiment of the present invention. In this FIG. 7, the same reference numerals have been retained for the similar parts which have the same functions as in FIG. 5 without repeating the description thereof.

In FIG. 7, a data signal is supplied from the data input terminal 20 to a first input terminal 41a of a first NAND gate 41 via two series-connected inverters 32 and 33 and further directly to a second input terminal 41b thereof of the NAND gate 41. A third input terinal 41c of the NAND gate 41 is connected to the control signal input terminal 23 via an inverter 24. The output of the first NAND gate 41 is supplied to the gate of the P-channel MOS transistor 42. The source of the MOS transistor 42 is connected to the power supply terminal 27 through the lead inductance 29 of the power supply line, together with the source of the P-channel MOS transistor 45 having the gate to which the output of the NAND gate 21 is supplied. Each of the drains of both the MOS transistors 42 and 45 is connected to the drain of the N-channel MOS transistor 26 and the output terminal 30. The sizes of the P-channel MOS transistors 42 and 45 are determined to be about 40% and 60% of the size of the P-channel MOS transistor 25 shown in FIG. 3, as in the previous embodiment. Thus, the P-type MOS transistor 25 of FIG. 2 is, in effect, replaced by the MOS transistors 42c and 45 of FIG. 7 to provide two charge paths for the capacitor C, similar to FIG. 7, as will be explained in detail. The remaining configuration is the same as in the conventional circuit shown in FIG. 2.

The operation of this second embodiment is an follows: First, when the OD signal at the control signal input terminal 23 is a logical "1", since the third input 41c of the first NAND gate 41 is a logical "0", the output of the first NAND gate 41 is a logical "1" irrespective of the second input 41b, so that the P-channel MOS transistor 42 is turned off. At this moment, since the MOS transistors 26 and 45 are both off as already described, this circuit will not operate.

Next, when the data signal and the OD signal are both at a logical "0" at both the input terminals 20 and 23, since one input 21a of the second NAND gate 21 and the first and second inputs 41a and 41b of the first NAND gate 41 are a logical "0", the outputs of both the NAND gates 21 and 41 are both a logical "1", so that both of the P-channel MOS transistors 42 and 45 are turned off. On the other hand, since both of the inputs 22a and 22b of the NOR gate 22 are a logical "0", the output of the NOR gate 22 is a logical "1", so that the N-channel MOS transistor 26 is turned off. Therefore, the electric charge of the load capacitance C is discharged through the MOS transistor 26, so that the terminal voltage of the load capacitance C drops to 0.

Figure 8A:
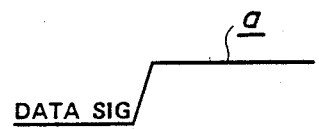
FIGS. 8A-8H are timing charts of various signals of the output circuit shown in FIG. 7.
Figure 8B:
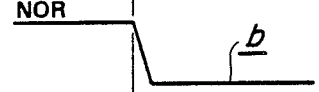
Figure 8C:
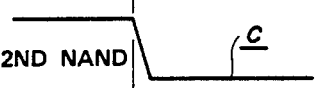
Figure 8D:
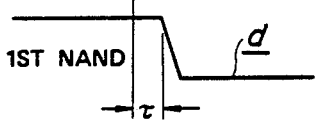

Under these conditions, when the data signal a changes from a logical "0" to a logical to "1" as shown in FIG. 8A, the output b of the first NOR gate 22 changes from a logical "1" to a logical "0" as shown in FIG. 8B, so that the N-channel MOS transistor 26 is turned off. At the same time, the output c of the second NAND gate 21 changes to a logical "0" as shown in FIG. 8C, so that the P-channel MOS transistor 45 is turned on. As shown in FIG. 8D, the first input 41a of the first NAND gate 41 changed to a logical "1" being delayed by time $\tau$ from the leading edge of the data signal a. Simultaneously, the output d of the first NAND gate 41 changes to a logical "0", so that the P-channel MOS transistor 42 is turned on.

Figure 8E:
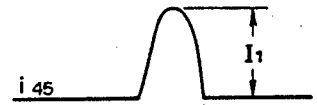
Figure 8F:
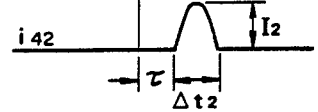
Figure 8G:
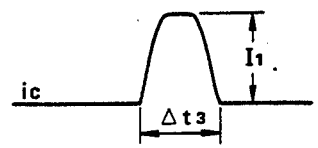
Figure 8H:
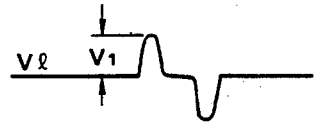

In the same way as in the previous embodiment, the load capacitance C is first charged by the current $i_{45}$ flowing through the 60% sized P-channel MOS transistor 45, as shown in FIG. 8E. When the terminal voltage of the load capacitance C rises to a some extent, the load capacitance C is charged by the current $i_{42}$ flowing through the 40% sized P-channel MOS transistor 42, as shown in FIG. 8F. The fact that the total charging current $i_c$ and the induced voltage at the power supply line have the same waveforms and the same effect as those of the total charging current $i_s$ and the induced voltage at the ground line of the first emboidment shown in FIG. 5, can readily be understood on the basis of the fact that only the polarity of the MOs transistors is different between both the embodiments, as depicted in FIGS. 8G and 8H.

Furthermore, it is possible to combine both the embodiments shown in FIGS. 5 and 7, to provide dual charging and discharging paths for the capacitor C in an output buffer memory.

As described above in detail, according to the present invention, since the path of the MOS transistors passing the charging and discharging currents of the load capacitance are appropriately divided into two paths and either one of the MOS transistors is turned on after being delayed relative to the others by an appropriate time, it is possible to obtain the output buffer circuit for a memroy which reduces the induced voltage due to the charge/discharge curent at the power supply line and the ground line without scarcely exerting a harmful influence upon the access time.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed:

1. An output buffer circuit of a memory, comprising:
   a pair of reference voltage source terminals each having a lead inductance, and a TTL circuit connected between said pair of reference voltage source terminals, a pair of complementarily-connected switching means connected in series between said pair of reference voltage source terminals for receiving a data signal at respective input terminals thereof and for deriving an output data signal at a common connection point between output terminals thereof to be connected to a load capacitance, wherein:

either of said pair of complementarily-connected switching means comprises first and second switching means connected to each other in parallel between said common connection of said output terminals of said pair of complementarily-connected switching means and one of said pair of reference voltage source terminals, and delay means cooperating with one of said first and second switching means, so that the data signal is applied to an input terminal of one of said first and second switching means and on a delayed basis to an input terminal of the other of said first and second switching means through said delay means, whereupon the load capacitance charges or discharges through the parallel paths respectively defined by said first and second switching means and said lead inductance in a way that the charge or discharge through one is delayed relative to the other in response to the delayed data signal.

2. An output buffer circuit comprising:

a pair of complementarily-connected switching means for receiving a data signal at respective input terminals thereof and for deriving an output data signal at a common connection between output terminals thereof to be connected to a load capacitance and an inductance in series to either of said pair of complementarily-connected switching means, wherein:

either of said pair of complementarily-connected switching means which is connected to said inductance comprises first and second switching means connected to each other in parallel between said common connection of said output terminals of said pair of complementarily-connected switching means and said inductance, and delay means cooperating with one of said first and second switching means, so that the data signal is applied to an input terminal of one of said first and second switching means and on a delayed basis to an input terminal of the other of said first and second switching means, whereupon said load capacitance charges or discharges through the parallel paths respectively defined by said first and second switching means and said inductance in a way that the charge or discharge through one is delayed relative to the other in response to the delayed data signal.

3. The circuit of claim 1, comprising said first and second switching means including N-channel MOS transistors, wherein the load capacitance is charged and discharged through said first and second switching means.

4. A circuit for charging and discharging a capacitive load, comprising a pair of switching means connected in series between a voltage supply terminal and a ground terminal, the series connection involving said two switching means being commonly connected at an output terminal for providing an output voltage for said charging and discharging of the capacitive load, a peripheral circuit connected in parallel with said pair of switching means, for receiving power between said voltage supply terminal and said ground terminal as reference voltages, and for providing control signals of predetermined levels and stability, inductance at least between one of said voltage supply and said voltage supply terminal and of said ground terminal and ground potential, sufficient to undesirably affect the respective one of said reference voltages when the capacitive load is charged or discharged, and accordingly affect said stability of any of said control signal levels, at least a first of said switching means, in correspondence to said at least one inductance, comprising two switches connected in parallel, and control means for controlling said pair of switching means, including each said switch thereof, to reduce the maximum voltage transient induced by each said inductance in either of said reference voltages as a result of said charging or discharging of the load capacitance, without substantially increasing the time for the respective charging and discharging over that which would be required if each switching means comprised a single switch, wherein said two switches are switched by two switching signals shifted slightly in time so that a first of said two switches first begins its discharge before the second of the two switches begins to discharge, and the total current for said charging or discharging divides between the two switches with partial overlap in time, each said switch having a characteristic of increasing peak current with size.

5. The circuit of claim 4, wherein said pair of series-connected switching means and said control means are provided such that said discharging or charging or said capacitive load can occur within approximately 2 nanoseconds.

6. The circuit of claim 4, comprising said pair of switching means including at least a first P-channel MOS transistor and at least a first N-channel MOS transistor which are complementarily connected, by their sources to said voltage supply and ground terminals, respectively, and in common by their drains to said output terminal, wherein one of said first P- and N-channel MOS transistors is said first switch of said first switching means, and any second switch of either one of said pair of switching means is a further MOS transistor of the same P- or N-channel type as the first switch of the same switching means.

7. The circuit of claim 6, comprising said first and second switches of said first switching means being respectively sized at about 60% and 40% of the size of a single MOS transistor of the same P- or N-channel type if provided in said first switching means and sized for said charging or discharging of said capacitive load.

8. The circuit of claim 6, said two switches of said first switching means both comprising N-channel MOS transistors, as a result of said inductance between said ground terminal and ground.

9. The circuit of claim 6, comprising a first NOR gate having its output connected to the gate of said first N-channel MOS transistor for switching it, and a first NAND gate having its output connected to the gate of said first P-channel MOS transistor for switching it.

10. The circuit of claim 9, comprising
said inductance arising between said ground terminal and ground,
said two switches of said first switching means comprising two of said N-channel MOS transistors, and
a second NOR gate having its output connected to the gate of the second N-channel MOS transistor for switching it.

11. The circuit of claim 4, comprising
said inductance arising between said voltage supply terminal and said voltage supply,
said two switches of said first switching means comprising two of said P-channel MOS transistors, and
a second NAND gate having its output connected to the gate of the second P-channel MOS transistor for switching it.

12. The circuit of claim 10, comprising
a data input terminal for receiving a data signal, said data terminal being connected to a first input of each of said NAND and first and second NOR gates, and through two inverters in series to a first input of said first NAND gate, and
an output disable input terminal for receiving an output disable signal, said output disable input terminal being connected to a second input of each of said first and second NOR gates, and via an inverter to a second input of said first NAND gate.

13. The circuit of claim 11, comprising
a data input terminal for receiving a data signal, said data terminal being connected to a first input of each of said first NAND and NOR gates, and through two inverters in series to a first input of said second NAND gate, and
an output disable input terminal for receiving an output disable signal, said output disable input terminal being connected to a second input of each of said first NOR gate, and via an inverter to a second input of each of said first and second NAND gates.

14. The circuit of claim 12, wherein said pair of series-connected switching means and said control means are provided such that said discharging or charging of said capacitive load can occur within 2 nanoseconds.

15. The circuit of claim 7, wherein both the peak and the slope-in-time of the current of the respective charging or discharging of said capacitive load are less than in the case of said single P-channel MOS transistor being provided.

16. The circuit of claim 4, wherein the characteristics of a tri-state device are provided at said output terminal.

17. The circuit of claim 12, wherein the characteristics of a tri-state device are provided at said output terminal.

18. The circuit of claim 13, wherein the characteristics of a tri-state device are provided at said output terminal.

19. The circuit of claim 6, comprising said first and second switches of said first switching means being respectively sized at about 60% and 40% of the size of a single MOS transistor of the same P- or N-channel type if provided in said first switching means and sized for said charging or discharging of said capacitive load.

* * * * *